United States Patent
Tezuka

(10) Patent No.: US 7,428,059 B2
(45) Date of Patent: Sep. 23, 2008

(54) MEASUREMENT METHOD AND APPARATUS, EXPOSURE APPARATUS, AND DEVICE MANUFACTURING METHOD

(75) Inventor: Taro Tezuka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/563,498

(22) Filed: Nov. 27, 2006

(65) Prior Publication Data

US 2007/0146688 A1  Jun. 28, 2007

(30) Foreign Application Priority Data

Dec. 27, 2005  (JP)  ............... 2005-374808

(51) Int. Cl.
*G01B 9/02* (2006.01)
*G01B 11/02* (2006.01)

(52) U.S. Cl. .................. 356/521; 356/494; 356/515

(58) Field of Classification Search ................ 356/515, 356/521, 491–495, 520
See application file for complete search history.

(56) References Cited

U.S. PATENT DOCUMENTS

| | | | | |
|---|---|---|---|---|
| 5,196,350 A | * | 3/1993 | Backman et al. ............. | 436/501 |
| 5,237,388 A | * | 8/1993 | Hirano et al. ................ | 356/491 |
| 5,341,312 A | * | 8/1994 | Lisson et al. ................ | 359/223 |
| 6,233,056 B1 | * | 5/2001 | Naulleau et al. ............. | 356/520 |
| 6,239,878 B1 | * | 5/2001 | Goldberg ..................... | 356/520 |
| 6,307,635 B1 | * | 10/2001 | Goldberg ..................... | 356/521 |
| 6,456,382 B2 | * | 9/2002 | Ichihara et al. .............. | 356/513 |
| 6,573,997 B1 | * | 6/2003 | Goldberg et al. ............. | 356/521 |
| 6,650,399 B2 | * | 11/2003 | Baselmans et al. ............ | 355/55 |
| 6,690,474 B1 | * | 2/2004 | Shirley ........................ | 356/603 |
| 7,230,717 B2 | * | 6/2007 | Brock et al. ................. | 356/495 |
| 7,283,252 B2 | * | 10/2007 | Kato ........................... | 356/521 |
| 7,295,327 B2 | * | 11/2007 | Ohkubo ....................... | 356/521 |
| 7,301,646 B2 | * | 11/2007 | Wegmann et al. ........... | 356/515 |
| 7,304,749 B2 | * | 12/2007 | Ohkubo ....................... | 356/515 |
| 2002/0191195 A1 | * | 12/2002 | Ichihara et al. .............. | 356/521 |
| 2004/0174533 A1 | * | 9/2004 | Nakauchi ..................... | 356/515 |
| 2005/0046865 A1 | * | 3/2005 | Brock et al. ................. | 356/495 |
| 2005/0190378 A1 | * | 9/2005 | Nakauchi ..................... | 356/515 |
| 2006/0044536 A1 | * | 3/2006 | Ohsaki ......................... | 355/52 |
| 2006/0044569 A1 | * | 3/2006 | Kato ........................... | 356/515 |
| 2006/0061757 A1 | | 3/2006 | Yamamoto et al. | |
| 2006/0187435 A1 | * | 8/2006 | Ohsaki ......................... | 355/55 |
| 2006/0262323 A1 | * | 11/2006 | Yamamoto ................... | 356/515 |

FOREIGN PATENT DOCUMENTS

JP  2004-273748  9/2004
JP  2005-375946  12/2005

* cited by examiner

*Primary Examiner*—Patrick Connolly
*Assistant Examiner*—Scott M Richey
(74) *Attorney, Agent, or Firm*—Morgan & Finnegan, LLP

(57) ABSTRACT

A measurement method measures a wavefront aberration of a target optical system using an interference pattern formed by lights from first and second image side slits. The first image side slit has a width equal to or smaller than a diffraction limit of the target optical system. The measurement method includes the steps of obtaining a first and second wavefronts having wavefront aberration information of the target optical system in ±45° directions relative to the polarization direction of the light, and calculating wavefront aberration of the target optical system based on the first and second wavefronts of the target optical system obtained by the obtaining step.

4 Claims, 13 Drawing Sheets

MEASUREMENT METHOD AND APPARATUS, EXPOSURE APPARATUS, AND DEVICE MANUFACTURING METHOD

BACKGROUND OF THE INVENTION

The present invention relates generally to a measurement method and apparatus, and particularly to a measurement method and apparatus for measuring an optical characteristic of a projection optical system that projects a pattern of a reticle (mask) to a substrate.

A projection exposure apparatus has so far been employed which uses the lithography technology to manufacture fine semiconductor devices such as a semiconductor device, e.g., an IC and an LSI, an imaging device, e.g., a CCD, a display device, e.g., a liquid crystal panel, a magnetic head. A projection exposure apparatus transfers a pattern of a reticle (mask) onto a substrate such a wafer via a projection optical system. Since the exposure apparatus is required to precisely transfer a pattern of a reticle to a substrate with a specified magnification, it is important to use a projection optical system that has an excellent imaging characteristic and a restrained aberration. Especially in recent years, finer processing to the semiconductor device progresses, and a pattern to be transferred has become sensitive to an aberration of an optical system. Accordingly, there is a demand to highly precisely measure a projection optical system's optical characteristic (e.g., a wavefront aberration) with the projection optical system included in an exposure apparatus. In addition, in order to improve productivity and economic efficiency, a simple, fast, and inexpensive measurement is also important.

Conventionally, a projection optical system's wavefront aberration has been measured by actually exposing a reticle pattern onto a wafer, and observing its resist image using such a means as a scanning electron microscope ("SEM"). This conventional measurement method has a problem in a poor reproducibility of measurement due to a difficult SEM operation and errors in a resist application and a development.

In order to rapidly and accurately measure a projection optical system's wavefront aberration, it is desirable to use an interference method, rather than using the conventional measurement method that exposes a pattern on a resist for evaluation. However, the conventional interference method that uses a Fizeau interferometer, a Twyman-Green interferometer, or the like makes an overall system's structure complex, thus implying a large-size and high-cost problem. Thus, it is difficult to mount the interferometer on an exposure apparatus, and the conventional interference method is not viable.

Therefore, an exposure apparatus is proposed that has a comparatively simple interferometer such as a point diffraction interferometer (hereinafter called a "PDI"), a line diffraction interferometer (hereinafter called an "LDI"), and the like. For example, see Japanese Patent Application, Publication No. 2004-273748.

However, a measurement of a wavefront aberration using the PDI or LDI does not consider a polarization state of a light incident upon an image side measurement pattern (or an image side slit), and causes a measurement error in measuring a wavefront aberration of an optical system having a large numerical aperture ("NA"). For example, when a high-NA optical system such as the projection optical system in the exposure apparatus is measured using the LDI, a width of the image side slit in its shorter direction becomes smaller than the wavelength of the incident light (or the exposure light). It is known that an amplitude or phase of a diffracted light from an opening smaller than the wavelength changes depending on polarization direction of the incident light and a direction of the opening, if the incident light is a linearly polarized light. Further, when a linearly polarized light enters a slit that is as large as or smaller than the incident light's wavelength, a diffracted light's amplitude or phase changes depending on a ratio between the linearly polarized light's sx-axis component and sy-axis component, where the sy-axis is an axis parallel to the slit's longitudinal direction, and the sx-axis is an axis parallel to its shorter direction.

FIG. 12 shows phase distributions (wavefronts) of a diffracted light from a slit when the linearly polarized light of the incident light is parallel to the sy-axis (TE) and is parallel to the sx-axis (TM). FIG. 13 shows amplitude distributions of a diffracted light from a slit when the linearly polarized light of the incident light is parallel to the sy-axis (TE) and is parallel to the sx axis (TM). The phase distribution and the amplitude distribution are calculated by using an electromagnetic field analysis (finite difference time domain ("FDTD") method). Referring to FIG. 12, a maximum of 45 mλ of a phase difference is seen in the wavefront of the TE-mode incident light and the wavefront of the TM-mode incident light. Further, referring to FIG. 13, the amplitude of the TM mode incidence is about one half of that of TE mode incidence.

The wavefront measurement using the LDI (hereinafter called "LDI measurement") measures a wavefront using a pair of orthogonal slits. For example, assume that the incident light is a linearly polarized light parallel to the X-axis, and the LDI measurement uses a slit parallel to the X-axis (hereinafter called "Y slit") and a slit parallel to the Y-axis (hereinafter called "X slit"). A coordination system is set such that an up-and-down direction of the apparatus is the Z-axis, a depth direction is the Y-axis, and a direction orthogonal to the Z-axis and Y-axis is the X-axis. In this case, a Y-axis directional diffracted wavefront from the Y slit is the wavefront labeled by the TE in FIG. 12, and an X-axis directional diffracted wavefront from the X slit is the wavefront labeled by the TM in FIG. 12.

The LDI's reference wavefront is calculated by using the Y-axis directional wavefront information of a diffracted wavefront from the Y slit, and the X-axis directional wavefront information of a diffracted wavefront from the X slit. Accordingly, as shown in FIG. 12, if a spherical equivalent differs between the diffracted wavefront from the X slit and the diffracted wavefront from the Y slit, an error corresponding to a cos 2θ component will occur in the combined reference wavefront. Thus, the polarized incident light causes an error in the LDI measurement, because a difference in diffracted wavefronts from the pair of slits becomes an error of the reference wavefront.

SUMMARY OF THE INVENTION

The present invention is directed to a measurement method that can highly precisely measure an optical characteristic of a target optical system using a simple, small and inexpensive interferometer.

A measurement method for measuring a wavefront aberration of a target optical system using an interference pattern formed by a light from a first image side slit, and a light from a second image side slit, the first and second image side slits being located at an image side of the target optical system, the first image side slit having, in a shorter direction, a width equal to or smaller than a diffraction limit of the target optical system, and the second image side slit having, in a shorter direction, a width greater than the diffraction limit of the target optical system includes the steps of obtaining a first wavefront and a second wavefront, the first wavefront having wavefront aberration information of the target optical system in a +45° direction relative to a polarization direction of a light incident upon the first and second image side slits, and the second wavefront having the wavefront aberration information of the target optical system in a −45° direction relative to the polarization direction of the light, and calculating wavefront aberration of the target optical system based on the first and second wavefronts of the target optical system obtained by the obtaining step.

A further object and other characteristics of the present invention will be made clear by the preferred embodiments described below referring to accompanying drawings.

DESCRIPTION OF THE EMBODIMENTS

Figure 1:
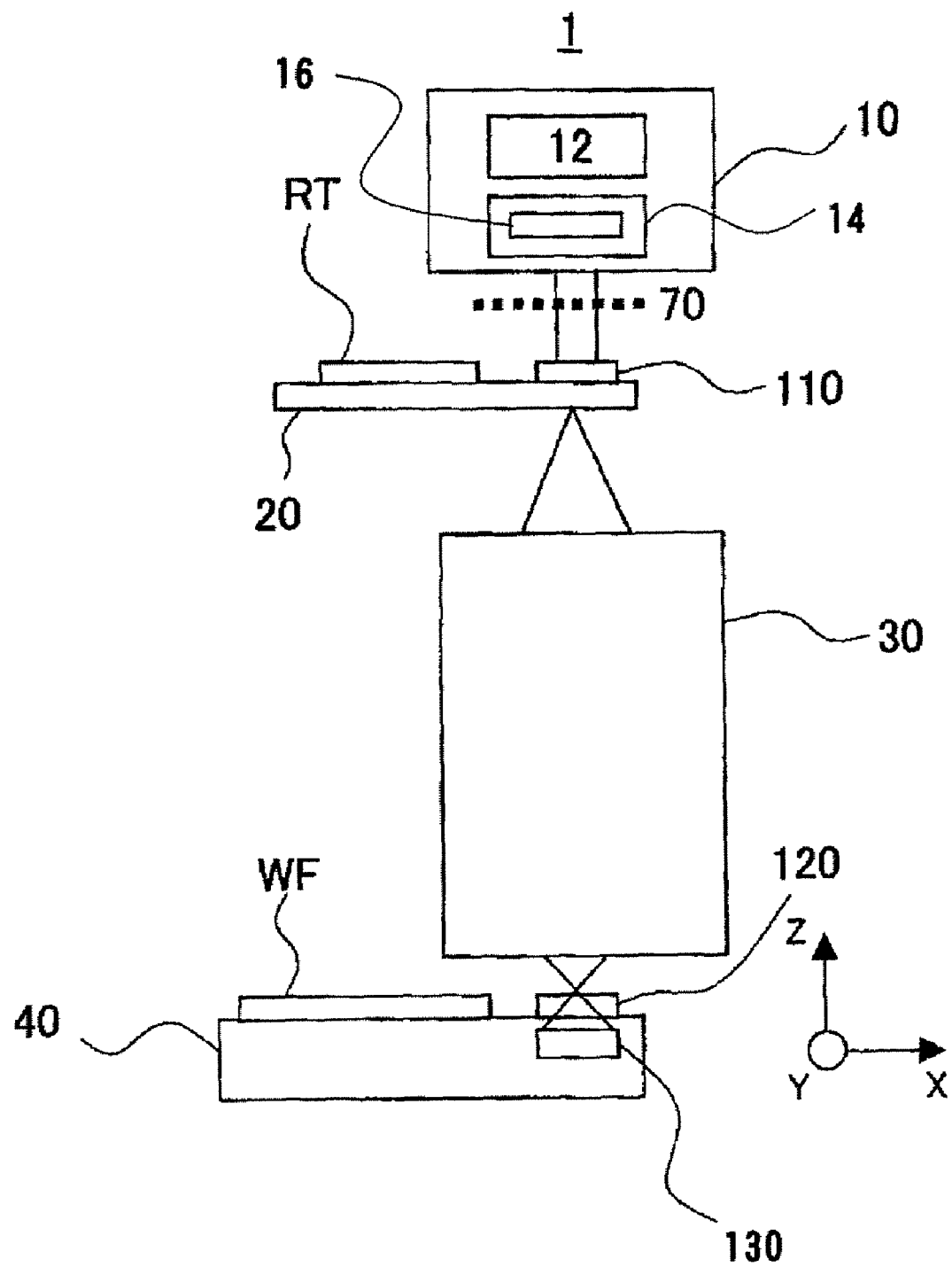
FIG. 1 is a schematic sectional view showing a structure of an exposure apparatus according to one aspect of this invention.

Referring now to the accompanying drawings, a description will be given of a preferred embodiment of this invention. In each figure, the same reference numeral is assigned to the same component to avoid a duplicate explanation.

Figure 6:
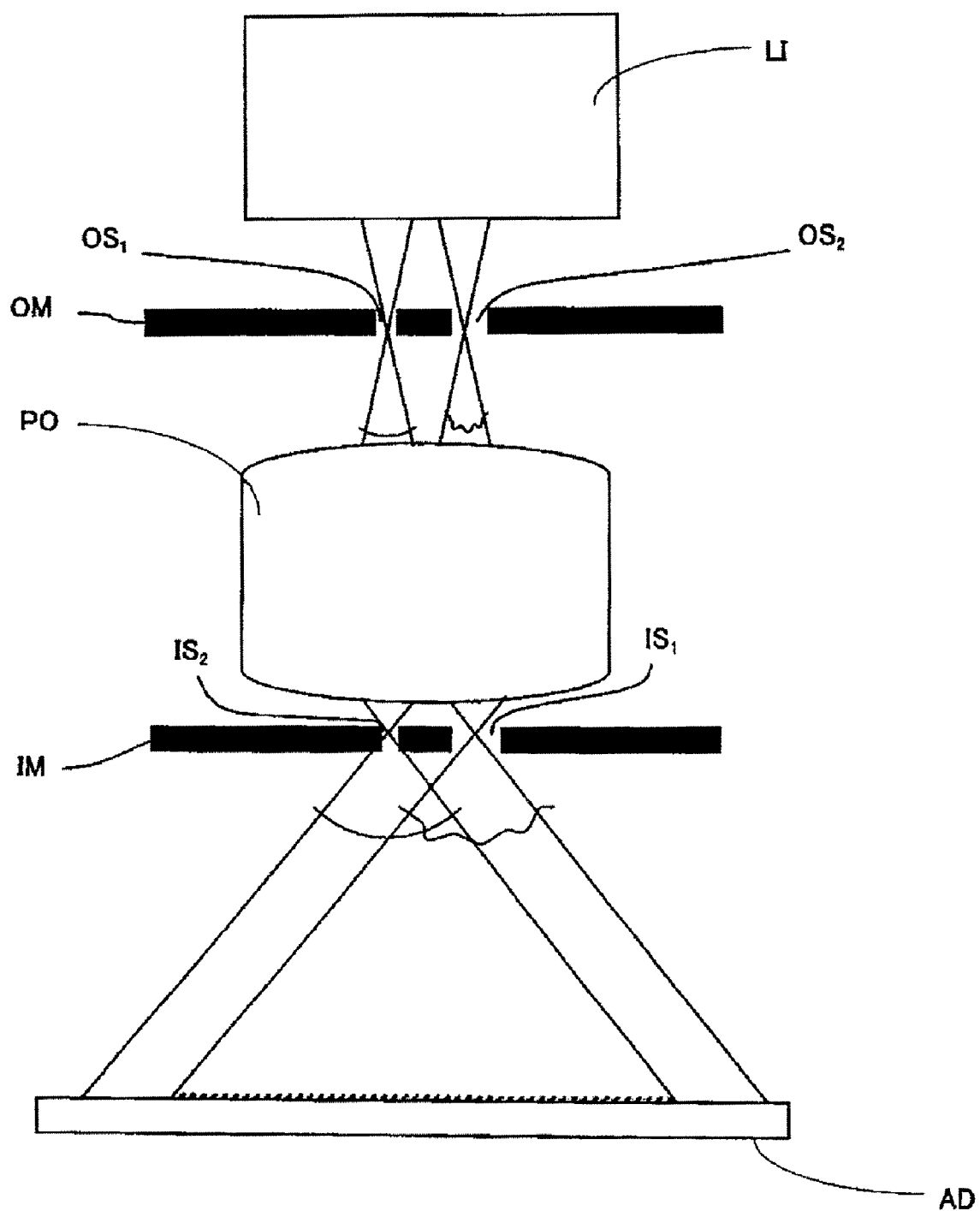
FIG. 6 is a view for explaining the principle of a wavefront measurement using the LDI.

Referring to FIGS. 6 to 8, a description will now be given of the principle of the wavefront measurement by LDI (or the LDI measurement).

Figure 7A:
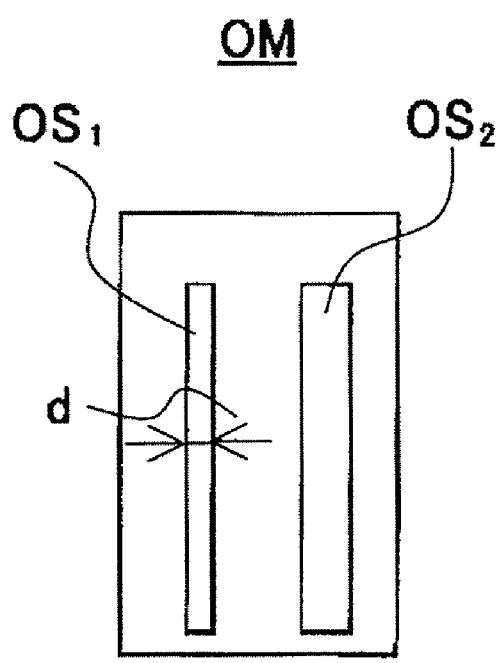
FIGS. 7A and 7B are schematic plan views showing an object side measurement mark and an image side measurement mark shown in FIG. 6.

The LDI measurement arranges an object side measurement mark OM having a pair of parallel adjacent slits, i.e., slit $OS_1$ and slit $OS_2$, at an object side of a target optical system PO. A (slit) width in a shorter direction of at least one slit in the object side measurement mark OM, i.e., the slit $OS_1$ in this embodiment, is made equal to or smaller than the resolving power of the target optical system PO at the object side. As shown in FIG. 7A, the width d of the slit $OS_1$ should preferably satisfy $d \leqq 0.5 \times \lambda/na$, where na is a numerical aperture of the target optical system PO at the object side, and $\lambda$ is a wavelength. Here, FIG. 7A is a schematic plan view of the object side measurement mark OM.

If the light from an illumination optical system L1 is used to illuminate the slits $OS_1$ and $OS_2$, the light exiting from the $OS_1$ has an aplanatic wavefront in the shorter direction of the slit $OS_1$. The slit $OS_2$ may have a width equal to or wider than that of the slit $OS_1$. When the slit $OS_1$ has a width wider than the resolving power of the target optical system PO at the object side, the light having a wavefront influenced by the aberration of the illumination optical system L1 is emitted from the slit $OS_2$.

A width in the longer direction of each of the slits $OS_1$ and $OS_2$ should be made narrower than the so-called isoplanatic region, in which the target optical system PO's aberration is regarded to be identical. In addition, the slits $OS_1$ and $OS_2$ are located adjacently so that the distance between them is narrower than the isoplanatic region.

The lights exiting from the slits $OS_1$ and $OS_2$ pass the target optical system PO, and their wavefronts are influenced by the target optical system's aberration, imaging the slits $OS_1$ and $OS_2$ on the image plane of the target optical system PO.

Figure 7B:
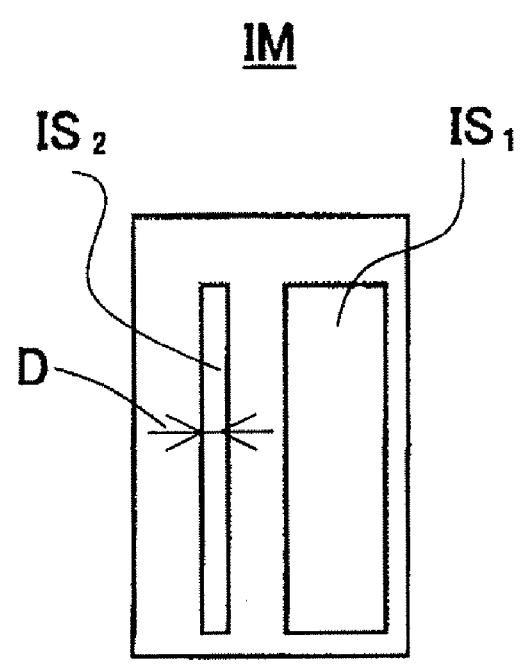

An image side measurement mark IM is located on the image side of the target optical system PO so that a slit $IS_1$ is located at the image position of the slit $OS_1$, and a slit $IS_2$ at the image position of the slit $OS_2$. The slit $IS_2$'s (slit) width in the shorter direction is set equal to or smaller than the resolving power of the target optical system PO on the image side. As shown in FIG. 7B, the width D of the slit $IS_2$ preferably satisfies $D \leqq 0.5 \times \lambda/NA$, where NA is a numerical aperture of the target optical system PO on the object side, and $\lambda$ is the wavelength. FIG. 7B is a schematic plan view showing the image side measurement mark IM.

A light imaged on the slit $IS_2$ has a wavefront affected by an aberration of the target optical system PO and also affected by an aberration of an illumination optical system L1 depending on the width of the slit $OS_2$. However, when passing through the slit $IS_2$ it has an aplanatic wavefront in the shorter direction of the slit $IS_2$.

On the other hand, the (slit) width of the slit $IS_1$ in the shorter direction is set sufficiently greater than the diffraction limit of the target optical system PO or is preferably about ten to hundred times as wide as the wavelength. The light imaged on the slit $IS_1$ has a wavefront affected only by the aberration of the target optical system PO in the shorter direction of the slit $IS_1$. Since the slit width or window of the slit $IS_1$ is sufficiently wide, the emitted light has a wavefront affected only by the aberration of the target optical system PO.

The lights from the slits $IS_1$ and $IS_2$ interfere with each other, forming an interference pattern. By detecting the interference pattern using a image sensor AD such as a CCD, a first primary wavefront of the target optical system PO is acquired which has a correct relative relationship in a measurement direction perpendicular to the longer direction of the slit. The "primary wavefront" is a wavefront having wavefront aberration information of the target optical system only in the measurement direction.

Figure 8A:
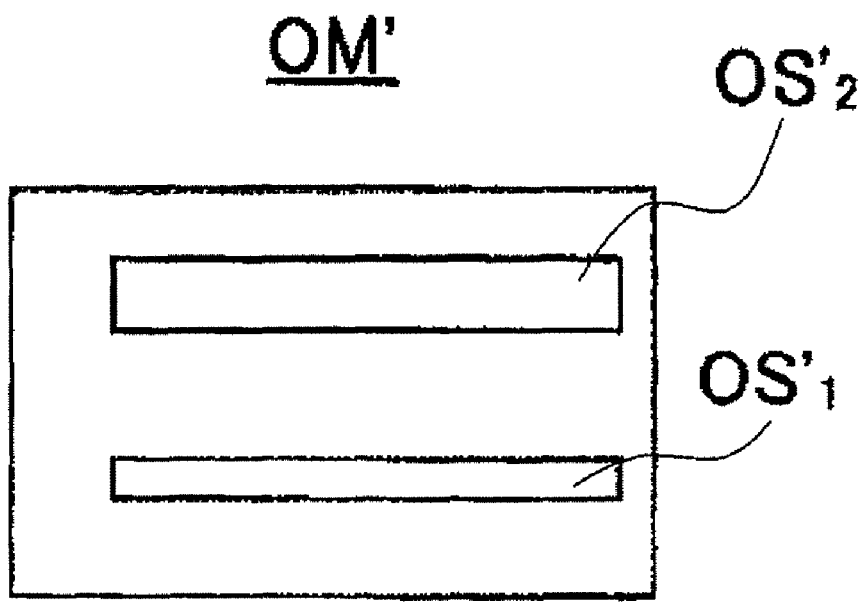
FIGS. 8A and 8B are schematic plan views showing an object side measurement mark and image side measurement mark having slits in a direction orthogonal to slits of the object side measurement mark shown in FIG. 7A and of the image side measurement mark shown in FIG. 7B.
Figure 8B:
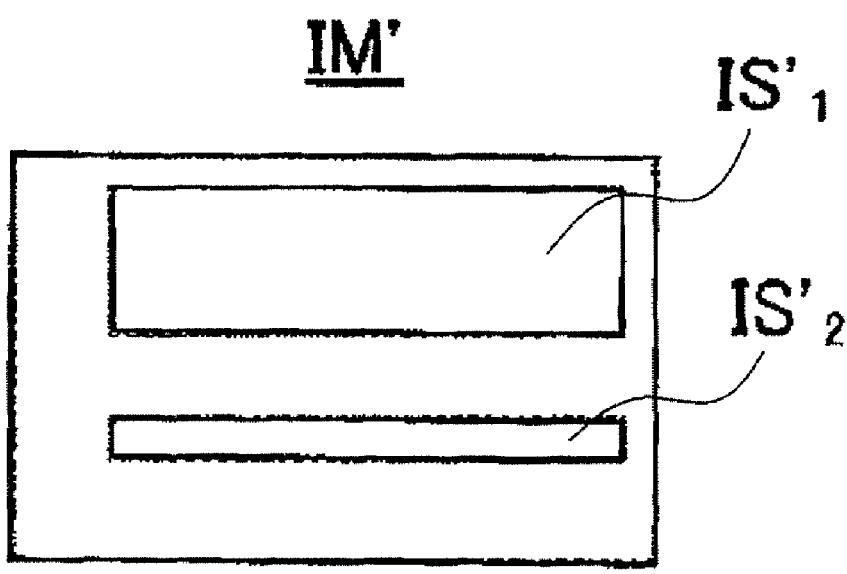

As shown in FIGS. 8A and 8B, object side measurement marks OM' and IM' having slits $OS_1'$, $OS_2'$, $IS_1'$, and $IS_2'$ in a direction orthogonal to the slits $OS_1$, $OS_2$, $IS_1$ and $IS_2$ are used to similarly obtain a second primary wavefront. FIG. 8A is a schematic plan view showing the object side measurement mark OM' having the slits in the direction orthogonal to the slits of the object side measurement mark OM. FIG. 8B is a schematic plan view showing the image side measurement mark IM' having the slits in the direction orthogonal to the slits of the image side measurement mark IM.

The wavefront of the target optical system PO can be obtained from phase information in two measurement directions using a pair of primary wavefronts, i.e., the first primary wavefront and the second primary wavefront.

Figure 9A:
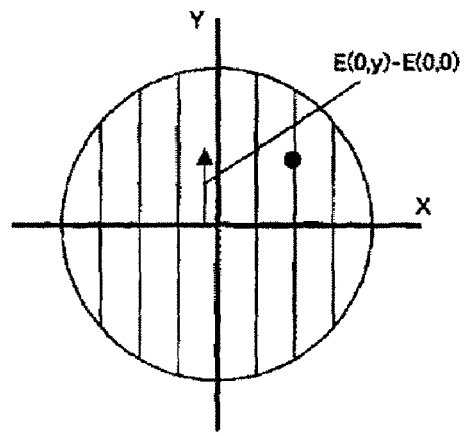
FIGS. 9A to 9C are views for explaining a method to calculate a wavefront of a target optical system from two primary wavefronts, and respectively show a first primary wavefront, a second primary wavefront, and a target optical system's wavefront.
Figure 9B:
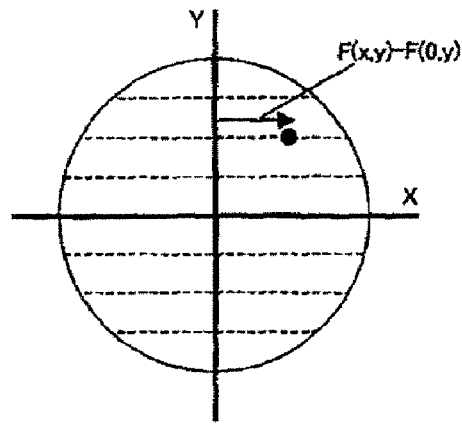
Figure 9C:
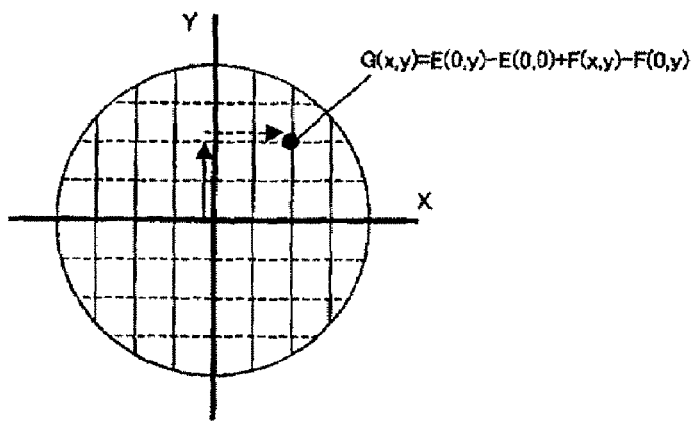

Referring now to FIGS. 9A to 9C, a description will be given of a method for obtaining wavefront information of the target optical system PG from two primary wavefronts. FIGS. 9A, 9B, and 9C show a first primary wavefront, a second primary wavefront, and a target optical system PO's wavefront, respectively. The phaseal relationship in FIG. 9A on a line parallel to the Y-axis is equal to the phaseal relationship on the same line in FIG. 9C. The phaseal relationship in FIG. 9B on a line parallel to the X-axis is equal to the phaseal relationship on the same line in FIG. 9C. From these relative relationships, the phase of an arbitrary point G (x, y) on a wavefront of the target optical system PO shown FIG. 9C is calculated as phase change amounts $E(0, y)-E(0, 0)$ and $F(x, y)-F(0, y)$ along the arrows in FIG. 9C, and expressed in the following equation:

$$G(x, y) = E(0, y) - E(0, 0) + F(x, y) - F(0, y) \quad [\text{EQUATION 1}]$$

The wavefront of the target optical system PO shown in FIG. 9C can be thus obtained from two primary wavefronts shown in FIGS. 9A and 9B. However, as mentioned above, the thus obtained wavefront of the target optical system PO contains a measurement error due to an error of a reference wavefront, since a polarization state of the light incident upon the image side measurement mark IM (slit $IS_1$ and slit $IS_2$) is not considered.

Accordingly, in measuring the wavefront of the target optical system using the LDI, this embodiment provides a measurement method and apparatus for reducing an error of a reference wavefront, and for highly precisely measuring the wavefront of the target optical system by specifying the direction of a linearly polarized light for an image side measurement mark (slit).

A description will now be given of a measurement method and apparatus as well as an exposure apparatus having such a measurement apparatus. FIG. 1 is a schematic sectional view showing the structure of an exposure apparatus 1 according to one aspect of this invention. The exposure apparatus 1 includes an illumination apparatus 10, a reticle stage 20 on which to locate a reticle RT, a projection optical system 30, and a wafer stage 40 on which to locate a wafer WF. The exposure apparatus further includes an object side measurement mark 110, an image side measurement mark 120, and a image sensor 130, which constitute a measurement apparatus (interferometer).

The exposure apparatus 1 is a projection exposure apparatus that exposes a circuit pattern of a reticle RT onto a wafer WF in a step-and-scan manner. The exposure apparatus 1 may use a step-and-repeat manner. In this embodiment, a description will be given below of a step-and-scan exposure apparatus as an example.

The illumination apparatus 10, which illuminates the reticle RT on which a circuit pattern to be transferred is formed, includes a light source section 12, and an illumination optical system 14. The illumination apparatus 10 illuminates an object side measurement mark 110, which will be described later.

For the light source section 12, for example, an ArF excimer laser with a wavelength of about 193 nm, a KrF excimer laser with a wavelength of about 248 nm, and the like can be used as a light source, and the number of lasers is not limited. The kind of a light source is not limited to the excimer laser, and an $F_2$ laser with a wavelength of about 157 nm may be used.

The illumination optical system 14 is an optical system that illuminates the reticle RT and the object side measurement mark 110. The illumination optical system 14 includes a polarization converter 16 that specifies a polarization state so that the light exiting from the light source section 12 can be a linearly polarized light. In other words, the polarization converter 16 transforms a randomly polarized light coming out of the light source section 12 into the linearly polarized light. The polarization converter 16 may serve to transform the polarization state of the light emitted from the light source 12 into a linearly polarized light that inclines by 45° relative to the slits in the object side measurement mark 110 and image side measurement mark 120, which will be described later.

The reticle RT is made, for example, of quartz, on which a circuit pattern to be transferred is formed, and is supported and driven by the reticle stage 20. The diffracted lights from the reticle RT pass the projection optical system 30, and are projected onto the wafer WF. The reticle RT and the wafer WF are located in an optically conjugate relationship. The exposure apparatus 1 is of a step-and-scan type, and a pattern on the reticle RT is transferred onto the wafer WF when the reticle RT and the wafer WF are scanned at a speed ratio of the reduction ratio.

The reticle stage 20 supports the reticle RT and the object side measurement mark 110 via a reticle chuck (not shown), and is connected to a transport mechanism (not shown). The transport mechanism (not shown) includes a linear motor etc., and drives the reticle stage 20 in the X-axis direction, thus moving the reticle RT and the object side measurement mark 110.

The projection optical system 30 serves to image, onto the wafer WF, the diffracted lights that have passed a pattern of the reticle RT. The projection optical system 30 may use a dioptric system solely including a plurality of lens elements, a catadioptric system including a plurality of lens elements and at least one concave mirror, etc.

The wafer WF is supported and driven by the wafer stage 40. A substrate to be exposed is the wafer WF in this embodiment, but may cover a wide range of substrates such as a glass plate and other processed objects. A photoresist is applied to the wafer WF.

The wafer stage 40 supports the wafer WF and the image side measurement mark 120. The wafer stage 40 may use any structure known in the art, and a detailed description of its structure and operation will be omitted. The wafer stage 40 can use a linear motor, for example, to move the wafer WF in the XY directions.

A description will now be given of a measurement apparatus or an interferometer that measures a wavefront aberration of a projection optical system. As described above, this apparatus includes the object side measurement mark 110, the image side measurement mark 120, and the image sensor 130. The exposure light emitted from the illumination apparatus 10 is utilized for the light for illuminating the object side measurement mark 110 and the projection optical system 30 as a target optical system.

Figure 2:
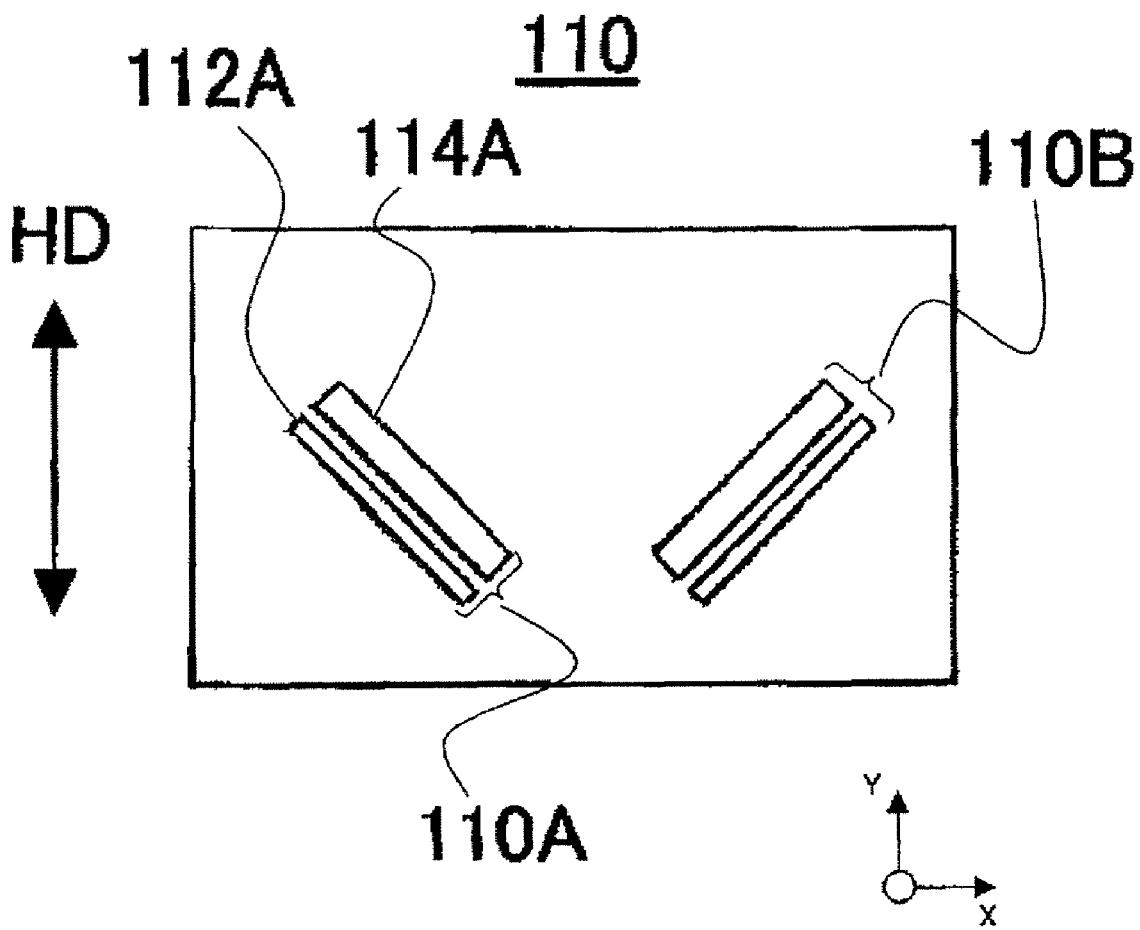
FIG. 2 is a schematic plan view showing the structure of an object side measurement mark shown in FIG. 1.
Figure 3:
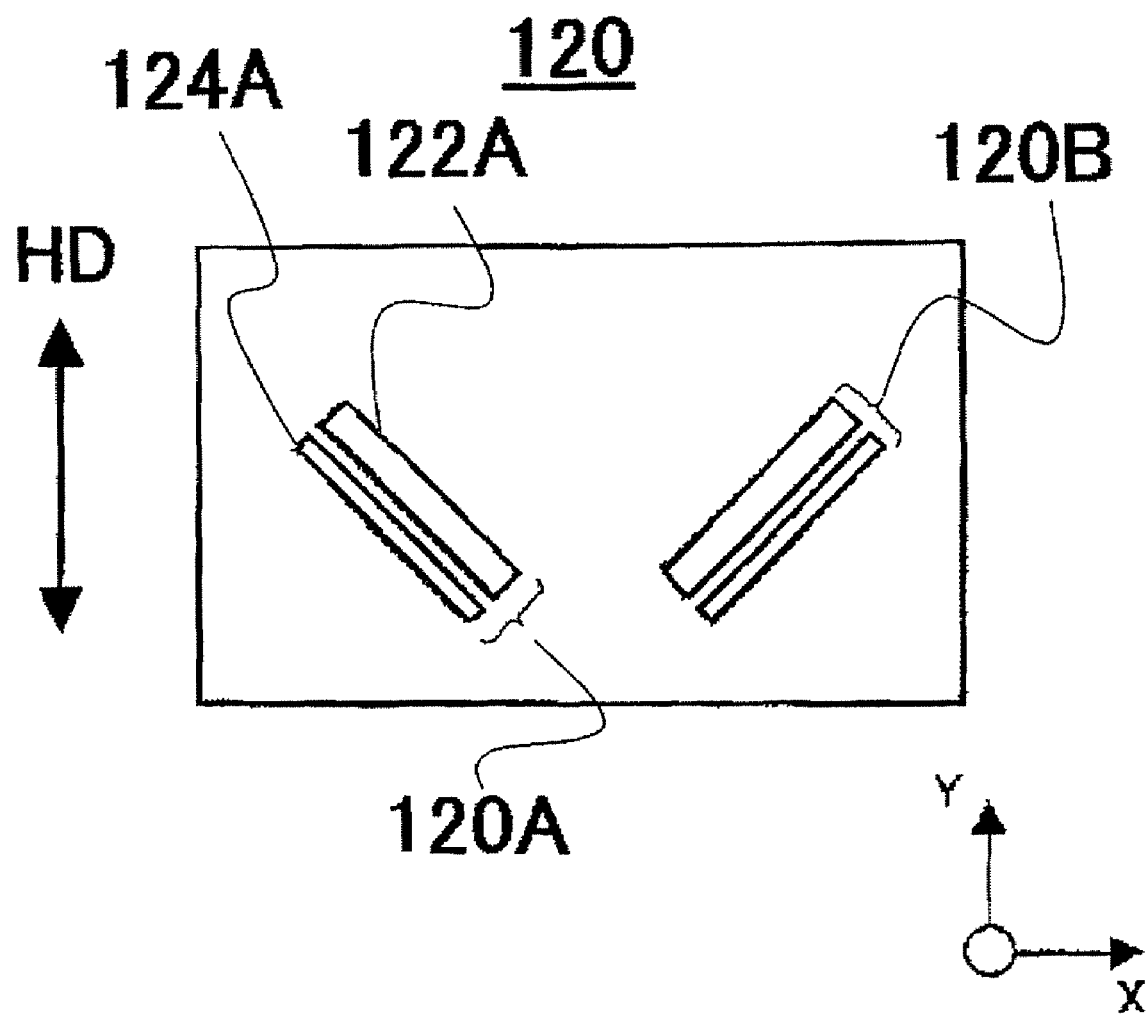
FIG. 3 is a schematic plan view showing a structure of an image side measurement mark shown in FIG. 1.

FIG. 2 is a schematic plan view showing a structure of the object side measurement mark 110 located on the reticle stage 20. FIG. 3 is a schematic plan view showing a structure of the image side measurement mark 120 located on the wafer stage 40.

As labeled by HD in FIGS. 2 and 3, the object side measurement mark 110 and the image side measurement mark 120 are illuminated by a linearly polarized light that is emitted from the illumination apparatus 10 and parallel to the Y-axis. The coordinate system is set to that of the projection optical system 30 such that the Z-axis is a up-and-down direction of the exposure apparatus 1, the Y-axis is a direction perpendicular to the paper plane, and the X-axis is a direction orthogonal to the Z-axis and Y-axis.

The object side measurement mark 110 has a first measurement pattern 110A and a second measurement pattern 110B. The image side measurement mark 120 has a first measurement pattern 120A and a second measurement pattern 120B.

The first measurement pattern 110A has a pair of slits 112A and 114A that incline by 45° to the X-axis on the object side measurement mark 110. These slits 112A and 114A are parallel to each other, and inclined by 45° to the X-axis. The (slit) width d of the slit 112A in its shorter direction is about $d=0.5 \times \lambda/na$, where na is a numerical aperture of the projection optical system 30 on the object side, and $\lambda$ is the wavelength of the exposure light from the illumination apparatus 10. The width of the slit 114A in its shorter direction is equal to or wider than that of the slit 112A in its short direction.

An image of the first measurement pattern 110A is formed onto the first measurement pattern 120A of the image side measurement mark 120 via the projection optical system 30. The first measurement pattern 120A has a pair of slits 122A and 124A that incline by 45° to the X-axis on the image side measurement mark 120. The slit 122A has a (slit) width in its shorter direction substantially greater than the diffraction limit of the projection optical system 30. The width D of the slit 124A in its shorter direction D is about $D=0.5 \times \lambda/NA$, where NA is the numerical aperture of the projection optical system 30 on the image side, and $\lambda$ is the wavelength of the exposure light from the illumination apparatus 10.

Two lights that have passed the first measurement pattern 120A interfere with each other, and form an interference pattern. This interference pattern is taken by the image sensor 130 on the wafer stage 40, providing the first primary wavefront of the projection optical system 30.

Similarly, the second primary wavefront of the projection optical system 30 can be obtained by using the second measurement pattern 110B of the object side measurement mark 110 and the second measurement pattern 120B of the image side measurement mark 120. More specifically, the reticle stage 20 is moved or the illumination optical system 14's illumination region is changed, and the second measurement pattern 110B of the object side measurement mark 110 is illuminated. Thereby, an image of the second measurement pattern 110B is formed on the second measurement pattern 120B of the image side measurement mark 120 via the projection optical system 30, thus providing the second primary wavefront of the projection optical system 30.

The second measurement patterns 110B and 120B are located close to the first measurement patterns 110A and 120A. The second measurement patterns 110B and 120B have a pair of slits in a direction orthogonal to the first measurement patterns 110A and 120A or corresponding to the first measurement patterns 110A and 120A rotated by 90°. The structures of these two slits are similar to those of the first measurement patterns 110A and 120A.

The wavefront of the projection optical system 30 is calculated from these two primary wavefronts, i.e., the first and second primary wavefronts. When the illumination area of the illumination optical system 14 is changed to illuminate the first measurement pattern 110A to the second measurement pattern 110B, the first measurement pattern 110A and the second measurement pattern 110B are located in the isoplanatic region.

In order to avoid a spherical aberration of a transparent plate having a measurement pattern, the object side measurement mark 110 and the image side measurement mark 120 are drawn on the PO side of the transparent plate. If the illumination optical system 14 has a poor spatial coherence, a grating 70 may be located above the object side measurement mark 110 so as to illuminate the measurement pattern (aperture) of the object side measurement mark 110 with an arbitrary order diffracted light.

Conventionally, in measuring a wavefront of a high-NA optical system, such as the projection optical system 30 in the exposure apparatus 1, the reference wavefronts obtained from two orthogonal slits contains a $\cos 2\theta$ component error, as mentioned above. In addition, due to the transmittance difference, even if an intensity ratio of one reference light is conformed with the tested light, the intensity ratio of the other reference light does not conform, thus degrading the contrast of the interference pattern.

This embodiment inclines a measurement pattern by 45° to the linearly polarized light, and equalizes the ratio between the X-axis and Y-axis components of the linearly polarized light for the two-directional slits. Then, the wavefronts and intensity ratios of the diffracted lights emitted from two slits become equal, and the above error is eliminated. While this embodiment inclines the measurement pattern (slit) by 45° to the linearly polarized light, a similar effect is obtained, for example, by controlling the linearly polarized light and by introducing a linearly polarized light having an angle of 45° to the measurement pattern (slit).

Figure 4:
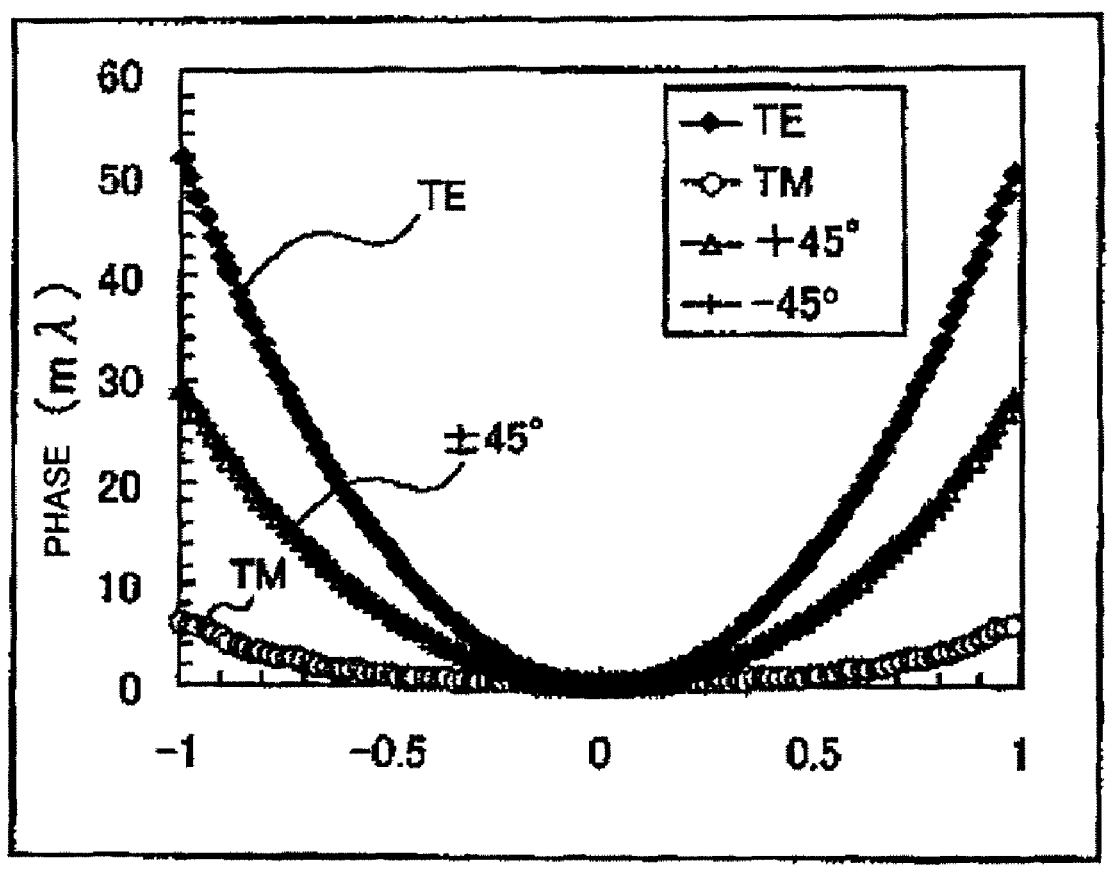
FIG. 4 is a graph showing phase distributions of diffracted lights from a slit when linearly polarized lights are incident parallel to the Y-axis, parallel to the X-axis, and at angles of ±45 degrees with respect to the X-axis.
Figure 5:
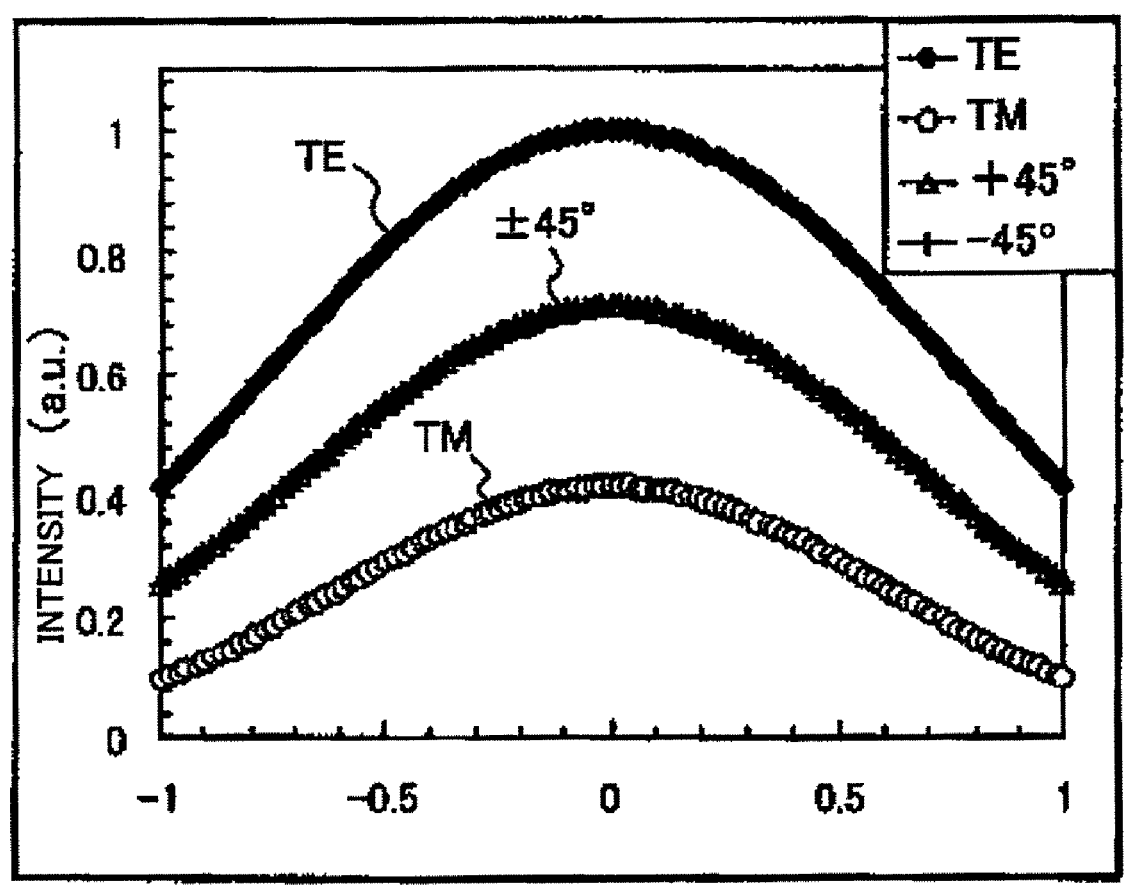
FIG. 5 is a graph showing amplitude distributions of diffracted lights from a slit when linearly polarized lights are incident parallel to the Y-axis, parallel to the X-axis, and at angles of ±45 degrees with respect to the X-axis.

FIG. 4 shows phase distributions or wavefronts of diffracted lights from the slits when the incident, linearly polarized lights are parallel to the Y-axis (TE) and the X-axis (TM), and form an angle of ±45° with the X-axis. FIG. 5 shows amplitude distributions of diffracted lights from the slit when the incident, linearly polarized light are parallel to the Y-axis (TE) and the X-axis (TM), and form an angle of ±45° with the X-axis. These phase distributions and amplitude distributions are obtained by the electromagnetic field analysis (FDTD method). Referring to FIGS. 4 and 5, the wavefront distribution and amplitude distribution are different between the diffracted lights of the TE and TM modes. However, it is understandable that use of the slits that incline by ±45° to the X-axis or incline by 45° with the incident, linearly polarized light equalize the wavefront distribution and amplitude distribution of the diffracted light from the respective slits. Hence, the reference wavefronts from the two orthogonal slits do not contain any $\cos 2\theta$ component error, and provide a highly precise measurement to a wavefront of a target optical system.

The exposure apparatus 1 thus uses the simple measurement apparatus (i.e., an object side measurement mark 110, an image side measurement mark 120, and a image sensor 130), and acquires precise aberration information or wavefront aberration over the pupil area in the projection optical system 30 that serves as a target optical system.

In addition, the projection optical system 30 has a correction optical system (not shown) that corrects the aberration of the projection optical system 30 by feeding back the measured wavefront aberration to the projection optical system 30. The correction optical system makes multiple optical elements (not shown) movable in and orthogonal to the optical-axis direction, and drives one or more optical elements based on the aberration information obtained by this embodiment. Thereby, it is possible to correct or optimize the wavefront aberration of the projection optical system 30. The adjusting mechanism of the aberration of the projection optical system 30 can use various known systems, in addition to the movable lens, such as a movable mirror (for a catadioptric or catoptric system), an inclinable plane-parallel plate, a pressure controllable space, an actuator-operated plane correction, and so on.

In exposure, the light emitted from the light source section 12, for example, Koehler-illuminates the reticle RT through the illumination optical system 14. The lights which have passed the reticle RT and reflect a reticle pattern are imaged on the wafer WF by the projection optical system 30. As described above, the projection optical system 30 in the exposure apparatus 1 has a well-corrected aberration, transmits the UV light, the far UV light, and the vacuum UV light with a high transmittance, and achieves an excellent imaging characteristic. Accordingly, the exposure apparatus 1 can provide high-definition devices (semiconductor devices, LCD devices, imaging devices (such as CCD, etc.), thin-film magnetic heads) with high throughput and economical efficiency. The simple measurement apparatus measures the wavefront aberration of the projection optical system 30 without increasing a size and the cost of an apparatus.

Figure 10:
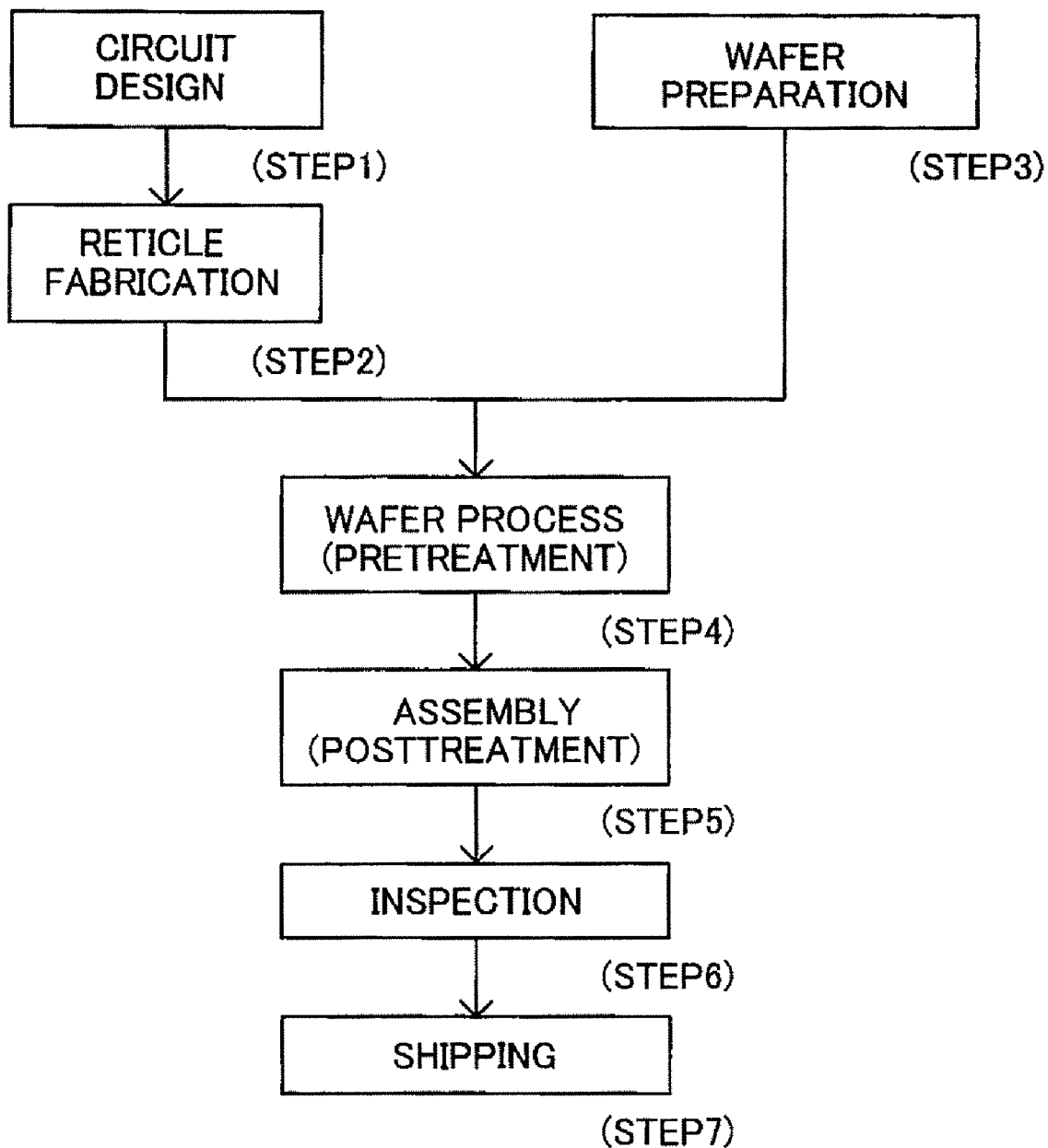
FIG. 10 is a flowchart for explaining fabrication of devices.
Figure 11:
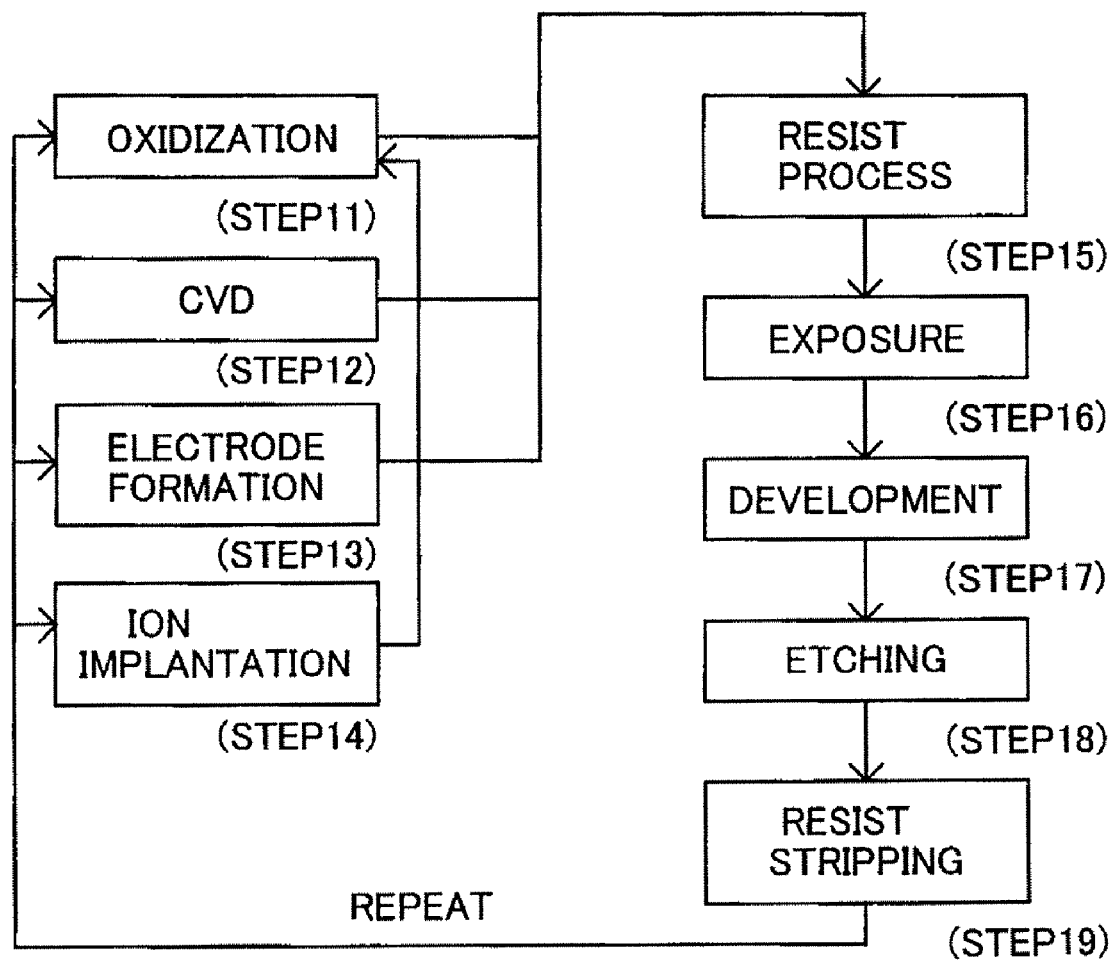
FIG. 11 is a detailed flowchart for a wafer process in step 4 shown in FIG. 10.
Figure 12:
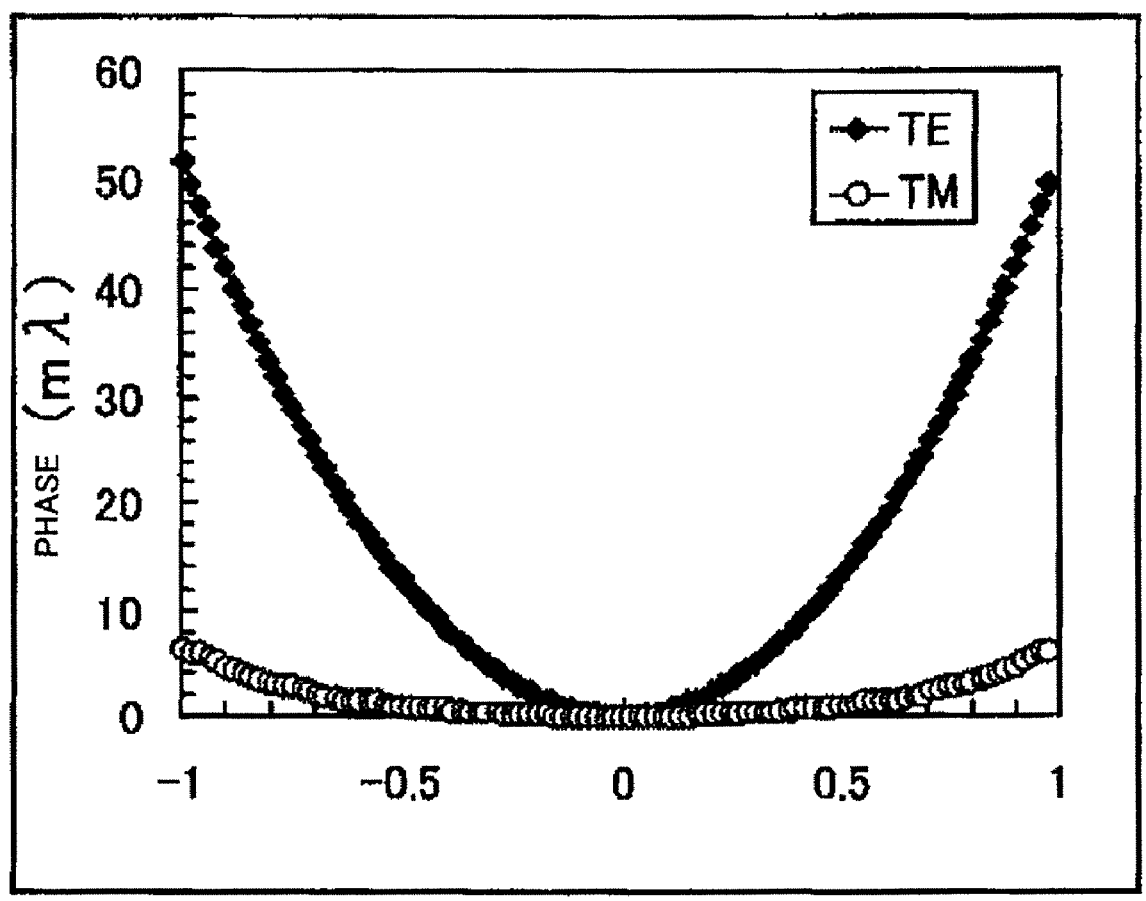
FIG. 12 is a graph showing phase distributions of diffracted lights from a slit when linearly polarized lights of incident lights are parallel to the sy-axis, and parallel to the sx-axis.
Figure 13:
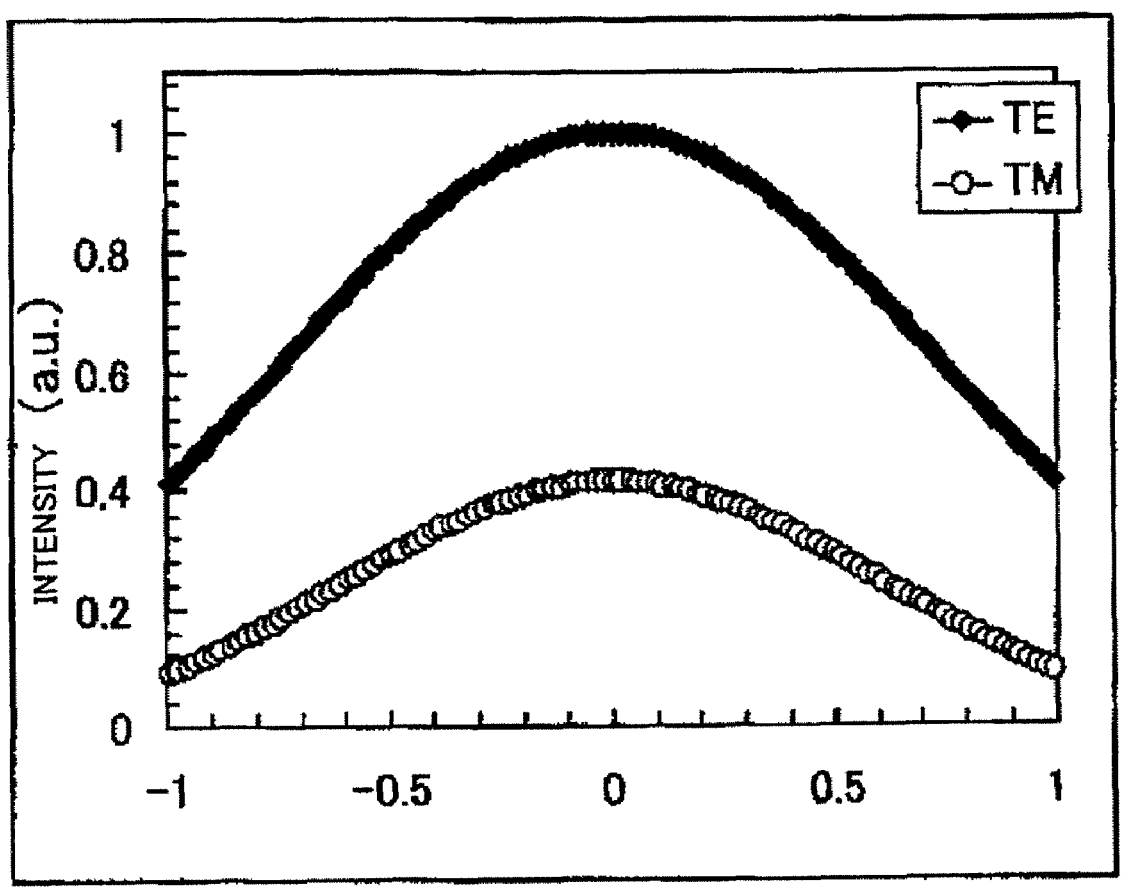
FIG. 13 is a graph showing amplitude distributions of diffracted lights from a slit when linearly polarized lights of incident lights are parallel to the sy-axis, and parallel to the sx-axis.

Referring to FIGS. 10 and 11, a description will now be given of an embodiment of a device manufacturing method using the above mentioned exposure apparatus 1. FIG. 10 is a flowchart for explaining how to fabricate devices (i.e., semiconductor chips such as IC and LSI, LCDs, CCDs). Here, a description will be given of the fabrication of a semiconductor chip as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is also referred to as a pretreatment, forms actual circuitry on the wafer through the photolithography of the present invention using the reticle and wafer. Step 5 (assembly), which is also referred to as a post-treatment, forms into a semiconductor chip the wafer formed in step 4 and includes a assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 11 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 1 to expose a circuit pattern of the reticle onto the wafer. Step 17 (development) develops the exposed wafer. Step 18 (etching) etches parts other than a developed resist image. Step 19 (resist stripping) removes disused resist after etching. These steps are repeated, and multi-layer circuit patterns are formed on the wafer. The device fabrication method of this embodiment may manufacture higher quality devices than ever. Thus, the device manufacturing method using the exposure apparatus 1, and resultant devices constitute one aspect of the present invention.

Furthermore, the present invention is not limited to these preferred embodiments and various variations and modifications may be made without departing from the scope of the present invention. For example, this embodiment uses a projection optical system in the exposure apparatus for a target optical system, but the target optical system is not limited to the projection optical system in the exposure apparatus. The target optical system may be another imaging optical system. Further, the present invention can also be applied to a shearing interferometer.

This application claims a foreign priority benefit based on Japanese Patent Application No. 2005-374808, filed on Dec. 27, 2005, which is hereby incorporated by reference herein in its entirety as if fully set forth herein.

What is claimed is:

1. A measurement method for measuring a wavefront aberration of a target optical system using a first interference pattern formed by a light from a first image side slit, and a light from a second image side slit, and a second interference pattern formed by a light from a third image side slit that has a longitudinal direction orthogonal to that of the first image side slit, and a light from a fourth image side slit that has a longitudinal direction orthogonal to that of the second image side slit, the first, second, third, and fourth image side slits being located at an image side of the target optical system, the first and third image side slits having, in a shorter direction, a width equal to or smaller than a diffraction limit of the target optical system, and the second and fourth image side slits having, in a shorter direction, a width greater than the diffraction limit of the target optical system, said measurement method comprising the steps of:
    obtaining a first wavefront from the first interference pattern, the first and second image side slits inclining by +45° to a polarization direction of a linearly polarized light incident upon the first and second image side slits;
    obtaining a second wavefront from the second interference pattern, the third and fourth image side slits inclining by −45° to the polarization direction of a linearly polarized light upon the third and fourth image side slits; and
    calculating wavefront aberration of the target optical system based on the first and second wavefronts of the target optical system obtained by said obtaining step.

2. A measurement apparatus for measuring an optical characteristic of a target optical system, said measurement apparatus comprising:
    an object side measurement mark having an object side slit located at an object side of the target optical system, the object side slit having a width in a shorter direction equal to or less than a diffraction limit of the target optical system;
    an image side measurement mark having a first image side slit, a second image side slit, a third image side slit, and a fourth image side slit at an image side of the target optical system, the first and third image side slits having, in a shorter direction, a width equal to or smaller than a diffraction limit of the target optical system, the second and fourth image side slits having, in a shorter direction, a width greater than the diffraction limit of the target optical system, the third image side slit having a longitudinal direction orthogonal to that of the first image side slit, and the fourth image side slit having a longitudinal direction orthogonal to that of the second image side slit
    a first detector for detecting a first interference pattern formed by lights from said first and second image side slits; and
    a second detector for detecting a second interference pattern formed by lights from said third and fourth image side slits.
    wherein said first image side slit and said second image side slit incline by 45° to a polarization direction of a linearly polarized light incident upon the first and second image side slits, and said third image side and said fourth image side slits incline by −45° to a polarization direction of a linearly polarized light upon the third and fourth image side slits.

3. An exposure apparatus for exposing a pattern of a reticle onto a substrate using a light from a light source, said exposure apparatus comprising:

a projection optical system for projecting the pattern onto the substrate; and a measurement apparatus for measuring an optical characteristic of said projection optical system using said light, wherein said measurement apparatus includes:

an object side measurement mark having an object side slit located at an object side of the target optical system, the object side slit having a width in a shorter direction equal to or less than a diffraction limit of the target optical system;

an image side measurement mark having a first image side slit, a second image side slit, a third image side slit, and a fourth image side slit at an image side of the target optical system, the first and third image side slits having, in a shorter direction, a width equal to or smaller than a diffraction limit of the target optical system, the second and fourth image side slits having, in a shorter direction, a width greater than the diffraction limit of the target optical system, the third image side slit having a longitudinal direction orthogonal to that of the first image side slit, and the fourth image side slit having a longitudinal direction orthogonal to that of the second image side slit;

a first detector for detecting a first interference pattern formed by lights from said first and second image side slits; and a second detector for detecting a second interference pattern formed by lights from said third and fourth image side slits, wherein said first image side slit and said second image side slit incline by 45° to a polarization direction of a linearly polarized light incident upon the first and second image side slits, and said third image side and said fourth image side slits incline by −45° to a polarization direction of a linearly polarized light upon the third and fourth image side slits.

4. An exposure apparatus for exposing a pattern of a reticle onto a substrate using a light from a light source, said exposure apparatus comprising:

an illumination optical system for illuminating the reticle using the light from the light source;

a projection optical system for projecting the pattern onto said substrate;

an object side measurement mark having an object side slit located at a reticle side of said projection optical system, the object side slit having a width in a shorter direction equal to or less than the diffraction limit of said projection optical system;

an image side measurement mark having a first image side slit, a second image side slit, a third image side slit, and a fourth image side slit at an image side of the target optical system, the first and third image side slits having, in a shorter direction, a width equal to or smaller than a diffraction limit of the target optical system, the second and fourth image side slits having, in a shorter direction, a width greater than the diffraction limit of the target optical system, the third image side slit having a longitudinal direction orthogonal to that of the first image side slit, and the fourth image side slit having a longitudinal direction orthogonal to that of the second image side slit;

a first detector for detecting a first interference pattern formed by lights from said first and second image side slits; and a second detector for detecting a second interference pattern formed by lights from said third and fourth image side slits, wherein said first image side slit and said second image side slit incline by 45° to a polarization direction of a linearly polarized light incident upon the first and second image side slits, and said third image side and said fourth image side slits incline by −45° to a polarization direction of a linearly polarized light upon the third and fourth image side slits.

* * * * *